United States Patent
Dow

(10) Patent No.: US 6,319,420 B1
(45) Date of Patent: Nov. 20, 2001

(54) METHOD AND APPARATUS FOR ELECTRICALLY ENDPOINTING A CHEMICAL-MECHANICAL PLANARIZATION PROCESS

(75) Inventor: Daniel B. Dow, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/599,077

(22) Filed: Jun. 21, 2000

Related U.S. Application Data

(62) Division of application No. 09/126,493, filed on Jul. 29, 1998, now Pat. No. 6,190,494.

(51) Int. Cl.[7] .................................................. H01L 21/302
(52) U.S. Cl. ........................ 216/86; 216/84; 216/88; 438/692; 438/5; 438/13; 438/17
(58) Field of Search .................. 216/84, 86, 88, 216/89, 100; 438/692, 693, 5, 10, 13, 17

(56) References Cited

U.S. PATENT DOCUMENTS

| | | | |
|---|---|---|---|
| 4,793,895 | 12/1988 | Kaanta et al. ............... | 156/627 |
| 5,036,015 | 7/1991 | Sandhu et al. ............... | 437/8 |
| 5,081,421 | 1/1992 | Miller et al. ............... | 324/671 |
| 5,234,868 | 8/1993 | Cote ............... | 437/225 |
| 5,321,304 | 6/1994 | Rostoker ............... | 257/621 |
| 5,337,015 | 8/1994 | Lustig et al. ............... | 324/671 |
| 5,559,428 | 9/1996 | Li et al. ............... | 324/71.5 |
| 5,562,529 | * 10/1996 | Kishii et al. ............... | 451/36 |
| 5,637,031 | * 6/1997 | Chen ............... | 451/41 |
| 5,685,766 | 11/1997 | Mattingly et al. ............... | 451/36 |
| 6,015,754 | * 1/2000 | Mase et al. ............... | 438/692 |
| 6,190,494 | * 2/2001 | Dow ............... | 156/345 |

FOREIGN PATENT DOCUMENTS

| | | |
|---|---|---|
| 61-8943 | 1/1986 | (JP) . |
| 6-120183 | 4/1994 | (JP) . |
| 8-139060 | 5/1996 | (JP) . |
| 10-189505 | 7/1998 | (JP) . |

* cited by examiner

*Primary Examiner*—Gregory Mills
*Assistant Examiner*—George Goudreau
(74) *Attorney, Agent, or Firm*—Dorsey & Whitney LLP

(57) ABSTRACT

A method and apparatus for endpointing a planarization process of a microelectronic substrate. The apparatus can include a source of electrical power having first and second electrical contacts coupled to the microelectronic substrate to form a conductive path through the substrate. An impedance of the conductive path changes as conductive material is removed from the substrate during planarization. In one embodiment, one contact can be attached to an upper surface of the substrate and the other contact can be attached to an intermediate surface between the upper surface and a lower surface of the substrate. In another embodiment, both contacts are connected to the intermediate surface and in still another embodiment, one contact can be connected to a retainer adjacent the substrate. In yet another embodiment, the power source induces a current in the conductive material, and the endpoint is detected by detecting a change in the induced current as the conductive material is removed.

50 Claims, 6 Drawing Sheets

METHOD AND APPARATUS FOR ELECTRICALLY ENDPOINTING A CHEMICAL-MECHANICAL PLANARIZATION PROCESS

CROSS-REFERENCE TO RELATED APPLICATION

This application is a Divisional of pending U.S. patent application Ser. No. 09/126,493, filed Jul. 29, 1998, now U.S. Pat. No. 6,190,494.

TECHNICAL FIELD

The present invention relates to methods and apparatuses for electrically endpointing a chemical-mechanical planarization process.

BACKGROUND OF THE INVENTION

Mechanical and chemical-mechanical planarizing processes (collectively "CMP") are used in the manufacturing of microelectronic devices for forming a flat surface on semiconductor wafers, field emission displays, and many other microelectronic substrates. FIG. 1 schematically illustrates a planarizing machine 10 with a platen or table 20, a carrier assembly 30, a polishing pad 21 positioned on the table 20, and a planarizing fluid 23 on the polishing pad 21. The planarizing machine 10 may also have an under-pad 25 attached to an upper surface 22 of the platen 20 for supporting the polishing pad 21. In many planarizing machines, a platen drive assembly 26 rotates (arrow A) and/or reciprocates (arrow B) the platen 20 to move the polishing pad 21 during planarization.

The carrier assembly 30 controls and protects a substrate 80 during planarization. The carrier assembly 30 typically has a substrate holder 32 with a pad 34 that holds the substrate 80 via suction. A carrier drive assembly 36 typically rotates (arrow C) and/or translates (arrow D) the substrate holder 32. The substrate holder 32, however, may be a weighted, free-floating disk (not shown) that slides over the polishing pad 21.

The combination of the polishing pad 21 and the planarizing fluid 23 generally defines a planarizing medium 28 that mechanically and/or chemically-mechanically removes material from the surface of the substrate 80. The polishing pad 21 may be a conventional polishing pad composed of a polymeric material (e.g., polyurethane) without abrasive particles, or it may be an abrasive polishing pad with abrasive particles fixedly bonded to a suspension material. In a typical application, the planarizing fluid 23 may be a CMP slurry with abrasive particles and chemicals for use with a conventional non-abrasive polishing pad. In other applications, the planarizing fluid 23 may be a chemical solution without abrasive particles for use with an abrasive polishing pad.

To planarize the substrate 80 with the planarizing machine 10, the carrier assembly 30 presses the substrate 80 against a planarizing surface 24 of the polishing pad 21 in the presence of the planarizing fluid 23. The platen 20 and/or the substrate holder 32 then move relative to one another to translate the substrate 80 across the planarizing surface 24. As a result, the abrasive particles and/or the chemicals in the planarizing medium 28 remove material from the surface of the substrate 80.

CMP processes must consistently and accurately produce a uniformly planar surface on the substrate to enable precise fabrication of circuits and photo-patterns. Prior to being planarized, many substrates have large "step heights" that create a highly topographic surface across the substrate. Yet, as the density of integrated circuits increases, it is necessary to have a planar substrate surface at several stages of substrate processing because non-uniform substrate surfaces significantly increase the difficulty of forming sub-micron features or photo-patterns to within a tolerance of approximately 0.1 $\mu$m. Thus, CMP processes must typically transform a highly topographical substrate surface into a highly uniform, planar substrate surface (e.g., a "blanket surface").

In the competitive semiconductor industry, it is desirable to maximize the throughput of CMP processing by producing a blanket surface on a substrate as quickly as possible. The throughput of CMP processing is a function of several factors, one of which is the ability to accurately stop CMP processing at a desired endpoint. In a typical CMP process, the desired endpoint is reached when the surface of the substrate is a blanket surface and/or when enough material has been removed from the substrate to form discrete components on the substrate (e.g., shallow trench isolation areas, contacts, damascene lines, etc.). Accurately stopping CMP processing at a desired endpoint is important for maintaining a high throughput because the substrate may need to be re-polished if the substrate is "under-planarized." Accurately stopping CMP processing at the desired endpoint is also important because too much material can be removed from the substrate, and thus the substrate may be "over-polished." For example, over-polishing can cause "dishing" in shallow-trench isolation structures, or over-polishing can completely destroy a section of the substrate. Thus, it is highly desirable to stop CMP processing at the desired endpoint.

In one conventional method for determining the endpoint of CMP processing, the planarizing period of one substrate in the run is estimated using the polishing rate of previous substrates in the run. The estimated planarizing period for a particular substrate, however, may not be accurate because the polishing rate may change from one substrate to another. Thus, this method may not accurately planarize all of the substrates in a run to the desired endpoint.

In another method for determining the endpoint of CMP processing, the substrate is removed from the pad and the substrate carrier, and then a measuring device measures a change in thickness of the substrate. Removing the substrate from the pad and substrate carrier, however, is time consuming and may delay further processing until the measurement is completed. Thus, this method generally reduces the throughput of CMP processing.

In still another method for determining the endpoint of CMP processing, a portion of the substrate is moved beyond the edge of the pad, and an interferometer directs a beam of light directly onto the exposed portion of the substrate and through a layer of the substrate to detect a thickness of the layer. The substrate, however, may not be in the same reference position each time it overhangs the pad. For example, because the edge of the pad is compressible, the substrate may not be at the same elevation for each measurement. Thus, this method may inaccurately measure the change in thickness of the layer of the wafer.

In yet another method for determining the endpoint of CMP processing, U.S. Pat. No. 5,036,015 discloses detecting the planar endpoint by sensing a change in friction between a wafer and the polishing medium. Such a change in friction may be produced by a different coefficient of friction at the wafer surface as one material (e.g., an oxide) is removed from the wafer to expose another material (e.g., a nitride). In addition to the different coefficients of friction caused by a change of material at the substrate surface, the friction between the wafer and the planarizing medium generally increases during CMP processing because more surface area of the substrate contacts the polishing pad as the substrate becomes more planar. U.S. Pat. No. 5,036,015 discloses detecting the change in friction by measuring the change in current through the platen drive motor and/or the drive motor for the substrate holder.

In still a further method for determining the endpoint of CMP processing, such as is disclosed in U.S. Pat. No. 5,559,428, the chemical composition of the CMP slurry is analyzed to determine when a layer of a first material has been removed to expose a layer of a second, different material. For example, planarization may continue through the first material until the second material is exposed, at which point some of the second material is removed and enters the slurry. The second material and the slurry is identified using instrumentation such as inductively coupled plasma for atomic emission spectroscopy, and the planarization process is halted.

In yet another method for determining the endpoint of CMP processing, such as is disclosed in U.S. Pat. No. 5,321,304, the substrate includes parasitic conductive contacts or terminals buried beneath an insulative layer. When the insulative layer over the contacts has been removed by planarization, the terminals come into electrical contact with probes in the polishing pad or the planarizing liquid, completing an electrical circuit and indicating the endpoint. A drawback with this method is that it is not suitable for determining the endpoint of a conductive layer.

In still a further method for determining the endpoint of CMP processing, such as is disclosed in U.S. Pat. No. 4,793,895, the substrate includes contacts or terminals positioned beneath an insulative layer and coupled to each other through circuitry internal to the substrate. The insulative layer is placed face down against a polishing pad that has two corresponding terminals coupled to a power source. When the insulative layer has been removed by planarization, the terminals in the polishing pad make electrical contact with the terminals of the substrate, completing an electrical circuit and indicating that the endpoint has been reached. The method can also be used to monitor the resistivity of a conductive layer. One drawback with this method is that at least one terminal is positioned in the polishing pad where it can become contaminated with slurry and other particulates. Another drawback with this method is that a conductive path must be maintained between the substrate and the polishing pad, which may be difficult during planarization because the substrate and the polishing pad move relative to one another.

SUMMARY OF THE INVENTION

The present invention is directed toward methods and apparatuses for detecting the removal of conductive material from a microelectronic substrate during planarization. In one aspect of the invention, the microelectronic substrate includes a first surface, a second surface with the conductive material opposite the first surface, and a conductive structure extending between and electrically coupled to the first and second surfaces. The apparatus can include a source of electrical power and two electrical contacts coupled to the source of electrical power and coupled to the microelectronic substrate. In one aspect of the invention, one electrical contact is removably coupled to the first surface of the substrate and the other electrical contact is connected to a retainer adjacent the microelectronic substrate. The retainer contacts a planarizing liquid and/or a polishing pad adjacent the substrate. In another aspect of the invention, the conductive material of the substrate can include upright portions that extend upwardly from the second surface, and the electrical contacts can be connected at spaced apart locations to the upright portions.

In still another aspect of the invention, the apparatus can include a source of variable electrical current coupled to an inductor. The inductor can be positioned at least proximate to the conductive material of the microelectronic substrate to induce an electrical current in the microelectronic substrate. The apparatus can further include a current detector to detect the induced electrical current. In one aspect of the invention, the current detector can be coupled directly to the conductive material of the microelectronic substrate. In another aspect, the current detector can be connected to the inductor to measure a change in the current passing through the inductor resulting from the current induced in the nearby substrate.

DETAILED DESCRIPTION OF THE INVENTION

The present invention is directed toward methods and apparatuses for endpointing the planarization of a microelectronic substrate. The apparatus can include a polishing pad with electrical contacts spaced apart from the polishing pad, or it can include an inductor that induces a current in a conductive portion of the microelectronic substrate. Many specific details of certain embodiments of the invention are set forth in the following description and in FIGS. 2–8 to provide a thorough understanding of such embodiments. One skilled in the art, however, will understand that the present invention may have additional embodiments and they may be practiced without several of the details described in the following description.

Figure 1:
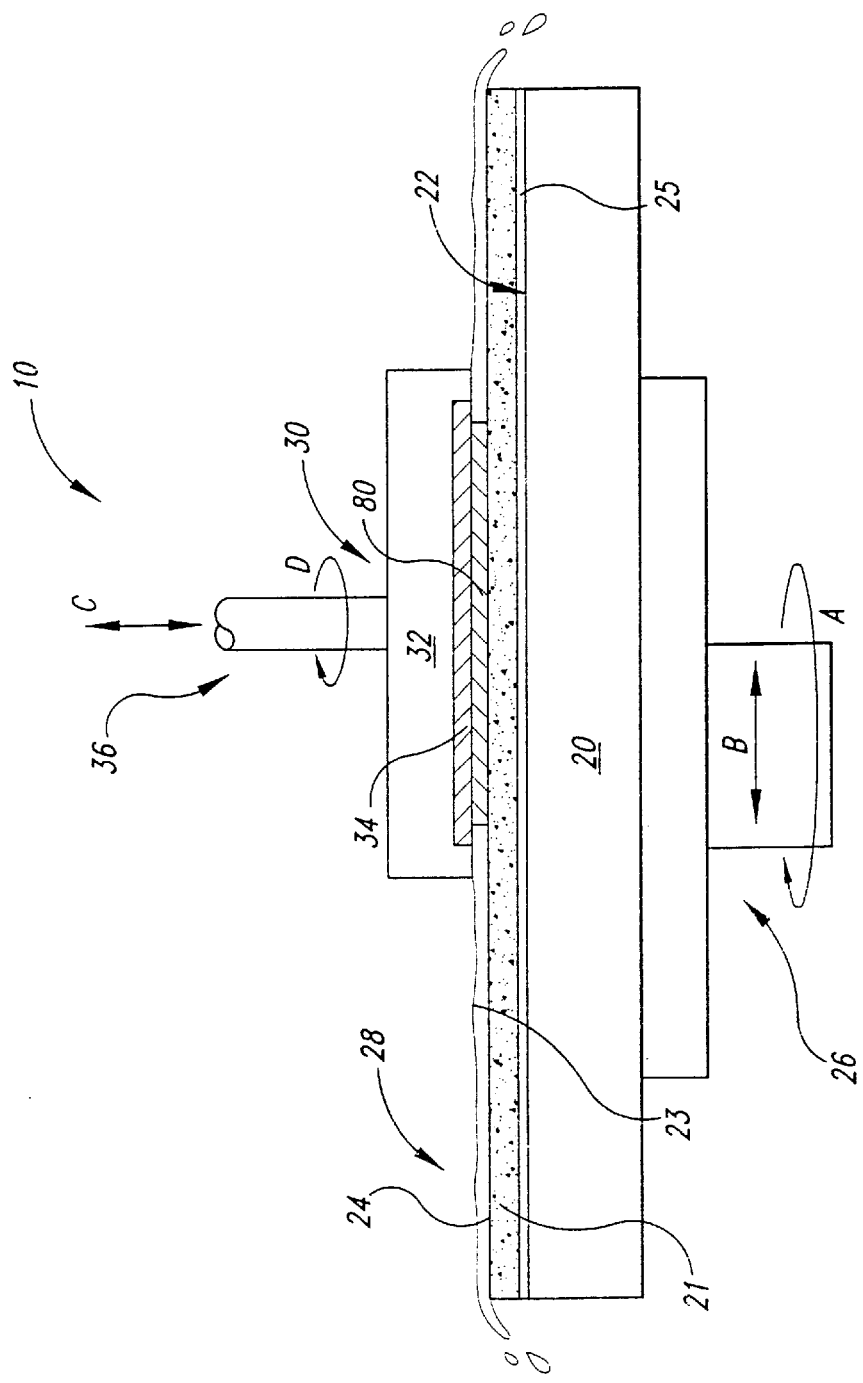
FIG. 1 is a partial cross-sectional elevation view of a chemical-mechanical planarization machine in accordance with the prior art.
Figure 2:
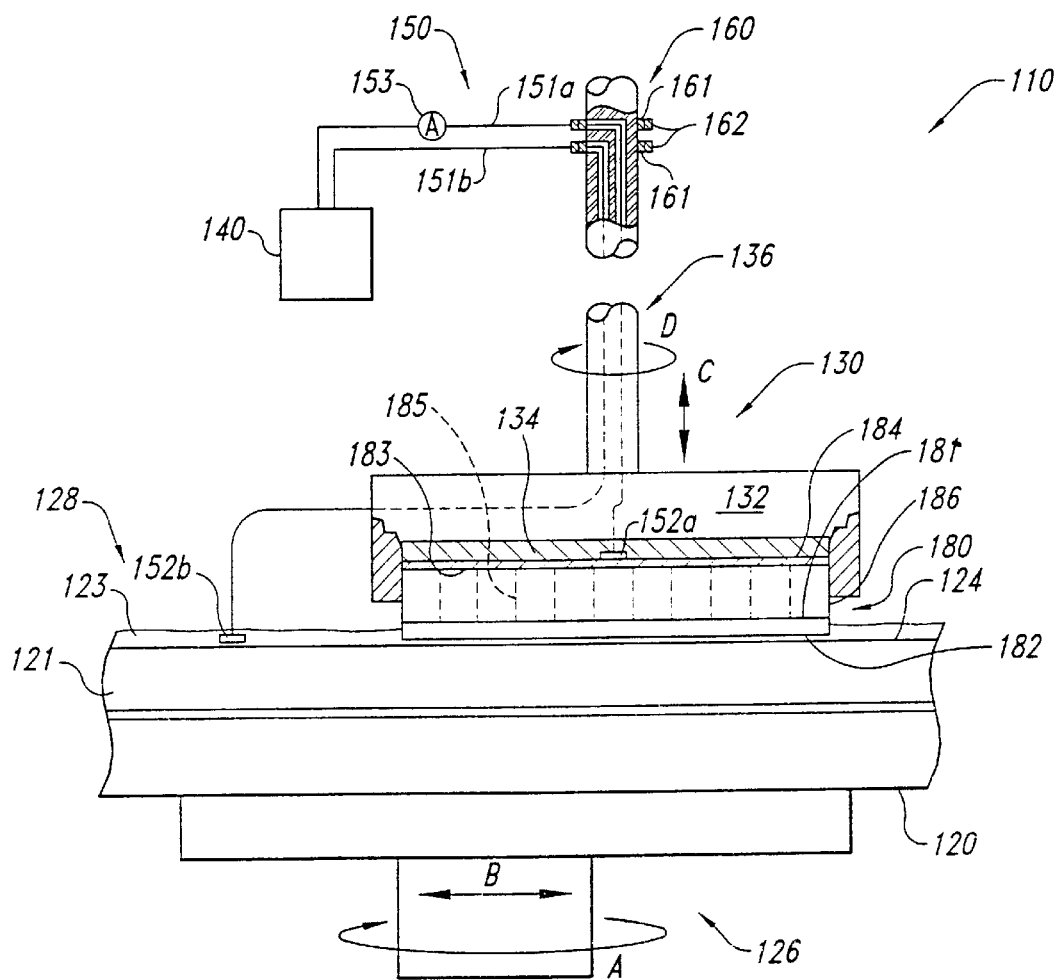
FIG. 2 is a partially schematic, partial cross-sectional elevation view of a chemical-mechanical planarization machine and a microelectronic substrate in accordance with an embodiment of the invention.
Figure 3A:
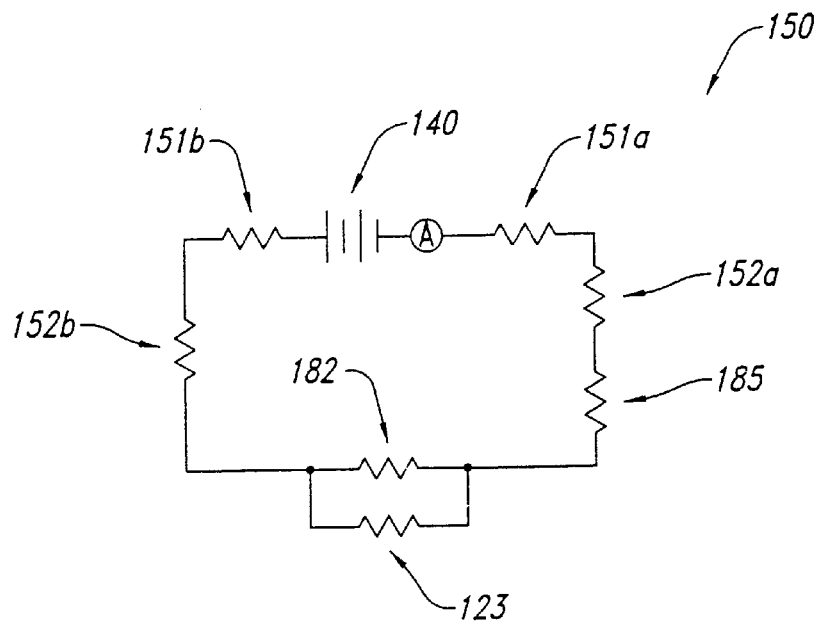
FIG. 3A is a schematic circuit diagram of resistances of components of the CMP machine and the microelectronic substrate of FIG. 2.
Figure 3B:
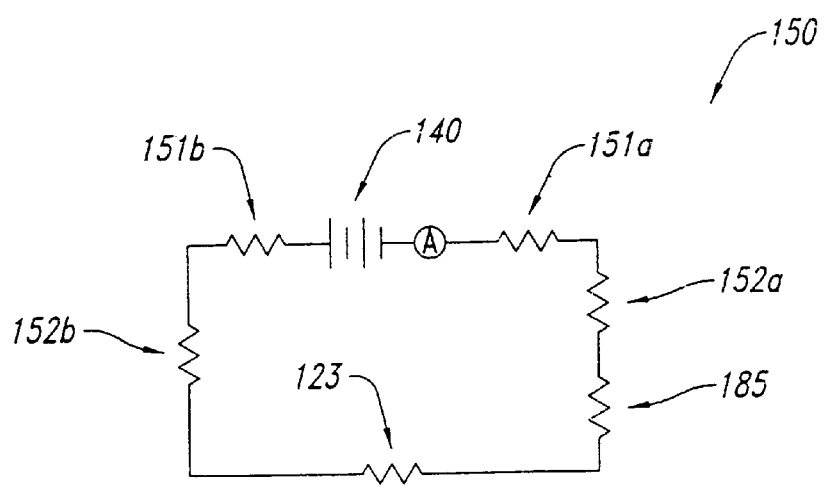
FIG. 3B is a schematic circuit diagram of resistances of components of the CMP machine and the microelectronic substrate shown in FIG. 2 after conductive material has been removed from the microelectronic substrate.

FIG. 2 illustrates a CMP machine 110 having a platen 120 and a planarizing medium 128. In the embodiment shown in FIG. 2, the planarizing medium 128 includes a polishing pad 121 releasably attached to the platen 120, and a planarizing liquid 123 disposed on a planarizing surface 124 of the polishing pad 121. The platen 121 can be movable by means of a platen drive assembly 126 that can impart rotational motion (indicated by arrow A) and/or translational motion (indicated by arrow B) to the platen 120. As was discussed above, the CMP machine 110 can also include a carrier assembly 130 having a substrate holder 132 and a resilient pad 134 that together press a microelectronic substrate 180 against the planarizing surface 124 of the polishing pad 121. A carrier drive assembly 136 can be coupled to the carrier assembly 130 to move the carrier assembly axially (indicated by arrow C) and/or rotationally (indicated by arrow D) relative to the platen 120.

The microelectronic substrate 180 can include a lower surface 181 adjacent to the planarizing medium 128, an upper or back surface 183 opposite the lower surface 181, and an intermediate surface 186 between the lower and upper surfaces 181 and 183. The lower surface 181 can include a lower conductive layer 182 and the upper surface 183 can include an upper conductive layer 184. One or more conductive structures 185, such as vias, extend between the lower conductive layer 182 and the upper conductive layer 184 to provide an electrical path between the lower and upper surfaces 181 and 183.

The substrate 180 can be electrically coupled to the CMP machine 110 via a conductive path 150. For example, in one embodiment, the conductive path 150 can include two conductive leads 151 (shown in FIG. 2 as 151a and 151b) that are connected to a power supply 140 and extend through the carrier assembly 136 to the substrate 180. In one embodiment, the conductive path 150 can include a rotating coupling 160 having fixed outer rings 162 that slidably engage rotating inner rings 161 in a conventional manner to transmit electrical signals from the stationary power supply 140 to the movable carrier assembly 136. In other embodiments, the CMP machine 110 can include other means to transmit electrical signals from the power supply 140 to the substrate 180.

Each of the conductive leads 151 terminates in an electrical contact 152 (shown in FIG. 2 as 152a and 152b). In one embodiment, an upper electrical contact 152a engages the upper conductive layer 184 of the substrate 180 and a lower electrical contact 152b extends outwardly from the carrier assembly 130 to engage the planarizing liquid 123. In one aspect of this embodiment, the planarizing liquid 123 is electrically conductive so that the conductive path 150 defines a complete electrical circuit extending from the power supply 140, through the conductive lead 151a, the upper electrical contact 152a, the upper conductive layer 184, and the conductive structure 185. The conductive path then extends through both the lower conductive layer 182 and a thin film of the planarizing liquid 123 beneath the lower conductive layer 182 to the lower electrical contact 152b. The current returns to the power supply 140 (or ground) via the conductive lead 151b. In one embodiment, an electrical current passing through the conductive path 150 can be detected and measured with a current detector 153, such as an ammeter, positioned anywhere along the conductive path 150.

Each element of the conductive path 150 described above is shown schematically in FIG. 3A as a resistor. The lower conductive layer 182 and the thin film of planarizing liquid 123 beneath the lower conductive layer 182 form parallel branches of the conductive path 150. Because the lower conductive layer 182 tends to have a much lower resistance than the planarizing liquid 123, most of the current through the conductive path 150 passes through the lower conductive layer 182. When the lower conductive layer 182 has been removed by planarization or other means to expose a less conductive portion of the substrate 180, the relatively low resistance path through the lower conductive layer 182 no longer exists and the current must pass through the relatively high resistance planarizing liquid 123 alone, as is shown schematically in FIG. 3B. Accordingly, the endpoint, i.e., the point at which the lower conductive layer 182 has been removed, can be detected by detecting a decrease in the current passing through the conductive path 150. The decrease in current passing through the conductive path 150 is caused by the increase in the overall resistance of the conductive path 150, which is in turn due to the loss of the lower conductive layer 182.

In one embodiment, the power supply 140 can generate a steady state or DC current, in which case a decrease in current through the conductive path 150 is due to an increase in the resistance of the conductive path, as discussed above. In another embodiment, the power supply can generate a variable or AC current, in which case the decrease in current through the conductive path is due to an increase in the impedance of the conductive path. Accordingly, the term resistance as used herein is intended to encompass reactance as well as resistance, i.e., impedance.

One advantage of the CMP machine 110 shown in FIG. 2 is that the conductive path 150 initially extends through the lower conductive layer 182, drawing a relatively high current from the power supply 140, until there is no longer a conductive connection between the lower conductive layer 182 and the lower electrical contact 152b. Accordingly, the CMP machine 110 can more accurately determine when endpointing has occurred because the loss of the lower conductive layer 182 may be indicated by a relatively sudden decrease in current through the conductive path 150. Furthermore, where there are several conductive structures 185 between the upper and lower conductive layers 184 and 182, the endpoint will be detected only when substantially all of the lower conductive layer 182 has been removed because the current through the conductive path 150 will remain relatively high as long as at least one conductive structure 185 is connected to the lower conductive layer 182. Accordingly, the CMP machine 110 can accurately determine the endpoint even if some regions of the substrate 180 planarize more quickly than others, because a sudden decrease in current through the conductive path 150 may occur only when so much of the lower conductive layer 182 is removed that all of the conductive structures 185 are electrically coupled only to the planarizing liquid 123.

Another advantage of the CMP machine 110 is that the lower electrical contact 152b can be positioned in a spaced apart relation to the polishing pad 121. Accordingly, the lower electrical contact 152b may be less susceptible to contamination by abrasives in the planarizing liquid 123, or particulate matter released from the polishing pad 121 and/or the substrate 180, when compared to a conventional contact positioned in the planarizing surface 124 of the polishing pad 121. As a result, the electrical resistance of the lower electrical contact 152b can remain generally constant during planarization. This feature can be important because an increase in the resistance of the lower electrical contact 152b could erroneously be interpreted as the resistance increase caused by removing the lower conductive layer 182, which could lead to a false indication of the endpoint.

The CMP machine 110 shown in FIG. 2 can be operated in accordance with an alternate embodiment of the invention by eliminating the planarizing liquid 123. For example, the planarizing medium 128 can include a fixed-abrasive polishing pad that does not require the planarizing liquid 123 to planarize the substrate 180. The polishing pad 121 can be electrically conductive to provide an electrical link between the substrate 180 and the lower electrical contact 152b, similar to the link provided by the planarizing liquid 123. The lower electrical contact can accordingly engage the planarizing surface 124 of the polishing pad 121. In one embodiment, the polishing pad 121 can have a resistance that is greater than the resistance of the lower conductive layer 182 so that the current through the conductive path 150 decreases when the lower conductive layer 182 is removed. In another embodiment, the polishing pad 121 can have a resistance that is less than the resistance of the lower conductive layer 182, so that the current through the conductive path 150 also decreases when the lower conductive layer 182 is removed. In either case, the resistance of the conductive path and therefore the current passing through the conductive path can change by a measurable amount upon removing the lower conductive layer 182.

Figure 4:
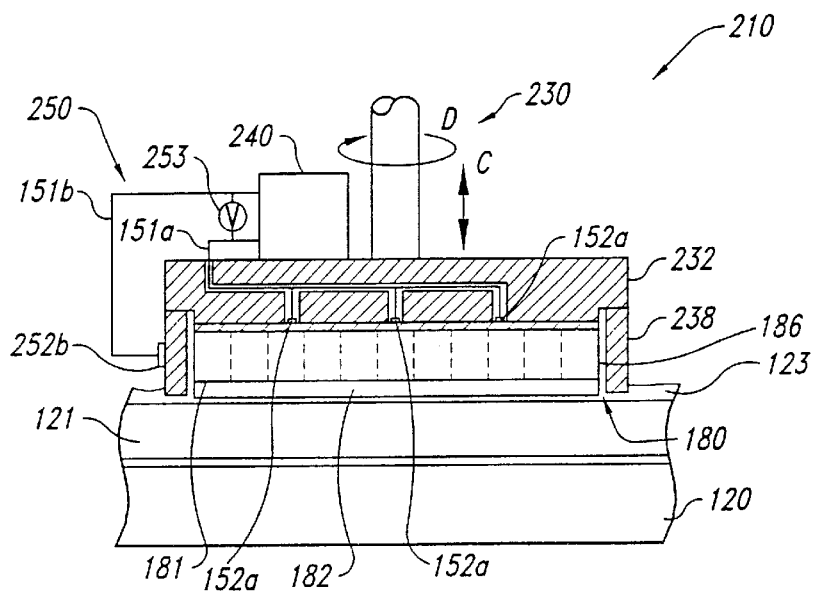
FIG. 4 is a cross-sectional elevation view of a portion of a CMP machine having an electrical contact coupled to a retainer in accordance with another embodiment of the invention.

FIG. 4 is a partial cross-sectional view of a portion of a CMP machine 210 having a carrier assembly 230 that includes a substrate holder 232 and a retaining ring 238 in accordance with another embodiment of the invention. The retaining ring 238 can be adjacent the intermediate surface 186 of the substrate 180, and can engage the intermediate surface 186 to prevent the substrate 180 from slipping out from beneath the substrate holder 232. In one embodiment, the retaining ring 238 can be electrically conductive, and the CMP machine 210 can include a retainer contact 252b electrically connected to the retaining ring 238 and to a power source 240. Accordingly, a conductive path 250 extends from the power source 240, through the substrate 180 and through two branches of a parallel circuit formed by the lower conductive layer 182 and the planarizing liquid 123, generally as was discussed above with reference to FIG. 2. The conductive path 250 then extends through the retaining ring 238 and the retainer contact 252b to the power source 240. The retaining ring 238 can either contact both the lower conductive layer 182 and the planarizing liquid 123 or the retaining ring 238 can contact the planarizing liquid 123 alone. In either case, the retainer contact 252b can be removably coupled to the retaining ring 238 so the retaining ring 238 can be removed from the carrier assembly 230 as necessary.

An advantage of the retaining ring 238 and the retainer contact 252b shown in FIG. 4 is that the retaining ring 238 can provide a more robust electrical connection with the planarizing liquid 123 (or the polishing pad 121) to reduce the likelihood of an inadvertent break in the conductive path 250. Such a break can prematurely indicate that the endpoint has been reached. A further advantage is that the relatively large retaining ring 238 may be less likely to become contaminated with particulates when compared to the lower electrical contact 151b shown in FIG. 2.

As shown in FIG. 4, the power source 240 can be mounted directly to the carrier assembly 230. Accordingly, the power source 240 can include batteries, solar cells, or other sources of electrical energy that do not require direct electrical connections to the moving carrier assembly 230. An advantage of this feature is that the conductive path 250 need not include a rotating coupling 160 (FIG. 2) or other means for coupling electrical power to the moving carrier assembly 230.

Where the power source 240 is a constant current source, the conductive path 250 can also include a voltmeter 253 connected between the conductive leads 151a and 151b to measure a voltage drop across the conductive path 250. Accordingly, the CMP machine 210 can be operated in generally the same manner as the CMP machine I 10 discussed above with reference to FIGS. 2–3B, except that the endpoint of the planarizing process can be indicated when a voltage across the conductive path 250 increases. The increase in voltage occurs as a result of the increased resistance created by current passing through the planarizing liquid 123 (or the polishing pad 121) rather than the planarizing liquid 123 (or the polishing pad 121) in parallel with the lower conductive layer 182. In other embodiments, the change in resistance of the conductive path 250 can be measured directly, for example, with an ohmmeter or with other devices. In still further embodiments, the CMP machine 210 can include other devices that measure or detect a characteristic of power provided to the conductive path 250.

Figure 5:
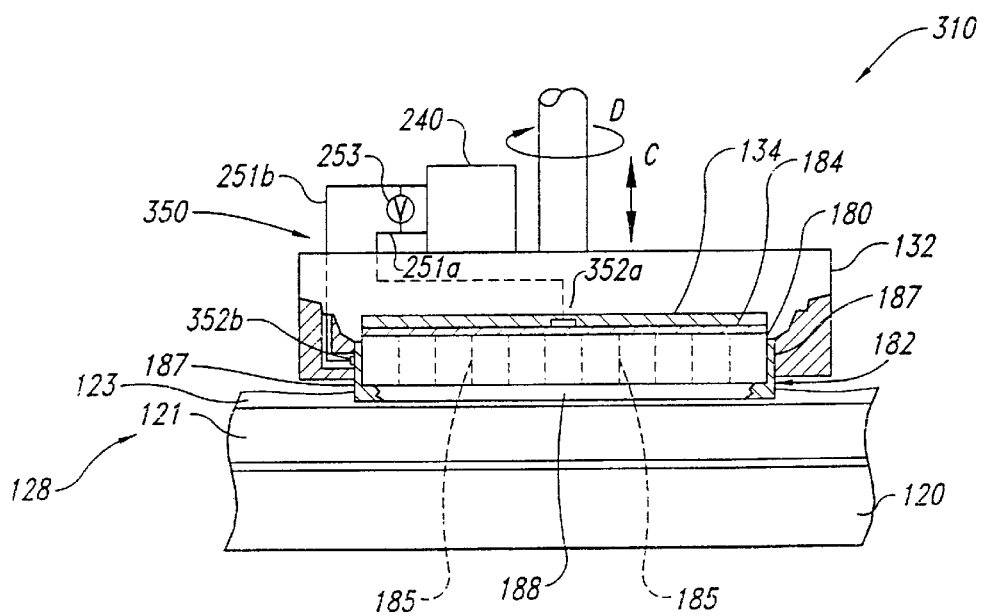
FIG. 5 is a cross-sectional elevation view of a portion of a CMP machine having an electrical contact coupled to an intermediate surface of a microelectronic substrate in accordance with still another embodiment of the invention.

FIG. 5 is a cross-sectional elevation view of a portion of a CMP machine 310 having an upper electrical contact 352a connected to the upper conductive layer 184 of the substrate 180 and a lower electrical contact 352b connected to an upward extending portion 187 of the lower conductive layer 182. Accordingly, a conductive path 350 initially extends from the upper conductive layer 184, through the conductive structures 185 to the lower conductive layer 182, then directly to the lower electrical contact 352b. When a lateral portion 188 of the lower conductive 182 has been removed by planarization (leaving the upward extending portions 187), the resistance of the conductive path 350 increases as current is routed through the planarizing liquid 123 or the polishing pad 121, generally as was discussed above with reference to FIG. 2.

An advantage of the CMP machine 310 shown in FIG. 5 is that the electrical contacts 352a and 352b do not contact the planarizing liquid 123 or the polishing pad 121, virtually eliminating the possibility that the contacts will become contaminated with particulate matter or other substances contained in the planarizing medium 128. Conversely, a potential drawback of the CMP machine 310 is that the endpoint of the CMP process might be prematurely indicated if the CMP process occurs unevenly, for example, if an annular region of the lower conductive layer 182 between the contacts 352a and 352b is planarized before the rest of the lower conductive layer. However, such an early indication may be unlikely where a plurality of conductive structures 185 extend between the upper and lower conductive layers 184 and 182.

Another advantage of the CMP machine 310 shown in FIG. 5 is that it may be particularly suitable for use with a planarizing medium 128 that includes an electrically non-conductive planarizing liquid 123 and/or an electrically non-conductive polishing pad 121. For example, because both electrical contacts 352 are connected directly to the substrate 180, the conductive path 350 need not include the planarizing medium 128. Accordingly, the endpoint can be indicated by an open circuit when the lateral portion 188 of the lower conductive layer 182 is removed and no electrical connections exist between the conductive structures 185 and the lower electrical contact 352b.

Figure 6:
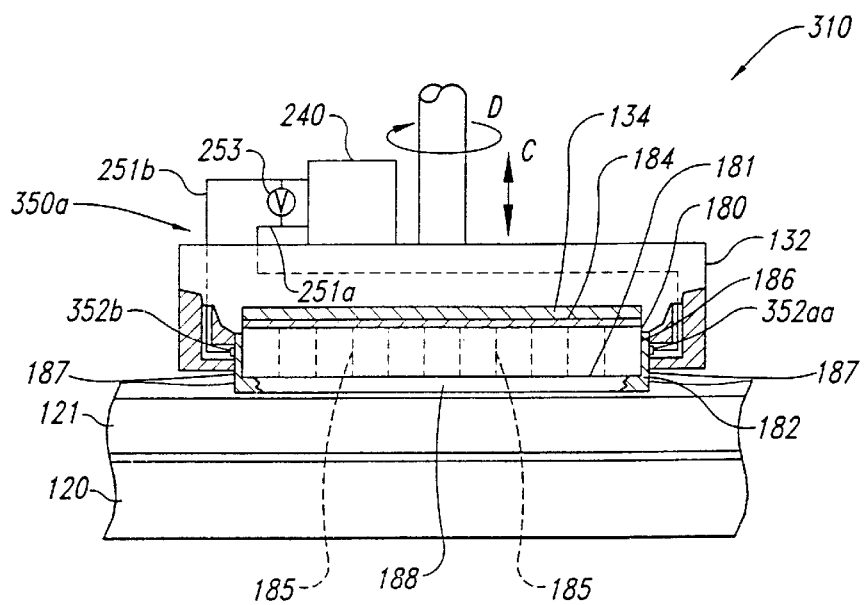
FIG. 6 is a cross-sectional elevation view of a portion of a CMP machine having two electrical contacts coupled to an intermediate surface of a microelectronic substrate in accordance with yet another embodiment of the invention.

FIG. 6 is a cross-sectional elevation view of a portion of the CMP machine 310 shown in FIG. 5, wherein both an upper electrical contact 352aa and the lower electrical contact 352b are connected to the upward extending portions 187 of the lower conductive layer 182. Accordingly, a conductive path 350a initially extends from the upper electrical contact 352aa to the lower electrical contact 352b both circumferentially around the substrate 180 (via the upward extending portions 187 of the lower conductive layer 182) and beneath the lower surface 181 of the substrate 180 (through the lateral portion 188 of lower conductive layer 182). The endpoint can be indicated when the lateral portion 188 of the lower conductive layer 182 has been removed, in a manner similar to that discussed above with reference to FIG. 5. In one embodiment, the lateral portion 188 is significantly thicker than the upward extending portions 187, so that although the conductive path 350a can extend circumferentially around the substrate 180 even after the lateral portion 188 has been removed, the resistance through the upward extending portions 187 is measurably greater than the combined resistance of both the lateral portion 188 and the upward extending portions 187.

In still another embodiment, the electrical contacts 352aa and 352b can be applied to the substrate 180 between the lower surface 181 of the substrate 180 and the lower conductive layer 182. The electrical contacts 352aa and 352b can be placed in this position where the lower conductive layer 182 extends over the intermediate surface 186, as shown in FIG. 5, or where the lower conductive layer 182 extends only over the lower surface 181, as shown in FIG. 4.

An advantage of the CMP machine 310 shown in FIG. 6 is that it does not require electrical contact with the upper conductive layer 184 of the substrate 180. Accordingly, the CMP machine 310 can endpoint the planarization process even where no electrical path exists through the substrate 180, for example, where the substrate 180 does not include conductive structures 185 between the upper and lower conductive layers 184 and 182, or where the substrate 180 does not include an upper conductive layer 184. Conversely, an advantage of the CMP machines shown in FIGS. 2–4 is that they can be used to endpoint substrates 180 having a lower conductive layer 182 that does not include upward extending portions 187.

Figure 7:
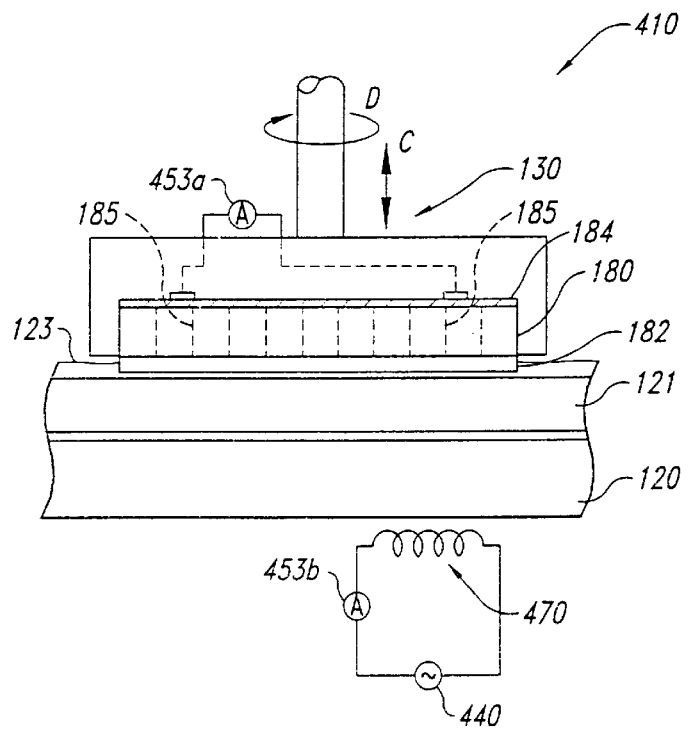
FIG. 7 is a partially schematic, cross-sectional elevation view of a portion of a CMP machine having an inductor in accordance with still another embodiment of the invention.

FIG. 7 is a partially schematic, cross-sectional elevation view of a portion of a CMP machine 410 that includes an inductor 470 coupled to a variable power source 440 in accordance with still another embodiment of the invention. In the embodiment shown in FIG. 7, the inductor 470 can be positioned beneath both the polishing pad 121 and the platen 120, proximate to the substrate 180. In other embodiments, the inductor 470 can have other positions relative to the substrate 180, as is discussed in greater detail below with reference to FIG. 8. The inductor 470 can include a coil, a plate, or other suitable means for inducing an electrical current in the nearby substrate 180.

When a variable current passes through the inductor 470, the inductor 470 induces a current in the lower conductive layer 182 of the substrate 180. The current can pass from the lower conductive layer 182, through the conductive structures 185 to the upper conductive layer 184. As the lower conductive layer 182 is removed, for example, by planarization, the current induced in the lower conductive layer 182 decreases. The decrease in current can be used to identify the removal of some or all of the conductive lower layer 182 and can be detected by a current detector 453a. In the embodiment shown in FIG. 7, the current detector 453a can include an ammeter connected between two spaced apart positions on the upper conductive layer. Alternatively, the current detector 453a can be coupled to any portion of the substrate 180, so long as it can detect current induced in the lower conductive layer 182 by the inductor 470.

In another embodiment, also shown in FIG. 7, a current detector 453b can be used in addition to or instead of the current detector 453a. The current detector 453b can be connected to the inductor 470 to detect changes in the current passing through the inductor 470 as a result of the current induced in the lower conductive layer 182. For example, the current induced by the inductor 470 in the lower conductive layer 182 can in turn induce a feedback current in the inductor 470. As the lower conductive layer 182 is removed, the feedback effect lessens, as detected by the current detector 453b. The endpoint can be determined when the feedback effect has substantially diminished or disappeared.

One advantage of an embodiment of the CMP machine 410 shown in FIG. 7 is that it does not require that a power source be connected directly to the substrate 180. Accordingly, the CMP machine 410 does not include rotating couplings, slip rings, or other connection means having moving components. The CMP machine 410 may therefore be less susceptible to mechanical failure.

Another advantage is that where the current detector 453b is connected to the inductor 470, no direct electrical connections exist between the substrate 180 and any other devices. Accordingly, it may be easier to engage and disengage the substrate 180 with the carrier assembly 130, and the likelihood for mechanical failure of contacts with the substrate 180 is substantially reduced. The throughput of the substrates 180 can also be increased because no time need be expanded to ensure proper electrical contact with the substrate 180.

Yet another advantage is that the inductor 470 can be positioned adjacent the platen 120 without connecting the inductor directly to the platen. This may be advantageous where the platen 120 moves relative to the carrier assembly 130 because electrical connections between the movable platen 120 and stationary surrounding structures can be susceptible to mechanical failure.

Still another advantage of the CMP machine 410 shown in FIG. 7 is that neither the polishing pad 121 nor the planarizing liquid 123 need be electrically conductive to induce a current in the lower conductive layer 181. In fact, it may be preferable that both the polishing pad 121 and the planarizing liquid 123 be non-conductive so as to provide less interference with the induced current. Accordingly, the CMP machine 410 shown in FIG. 7 may be particularly suitable for use with fixed abrasive polishing pads that may be manufactured primarily from non-conductive materials.

Figure 8:
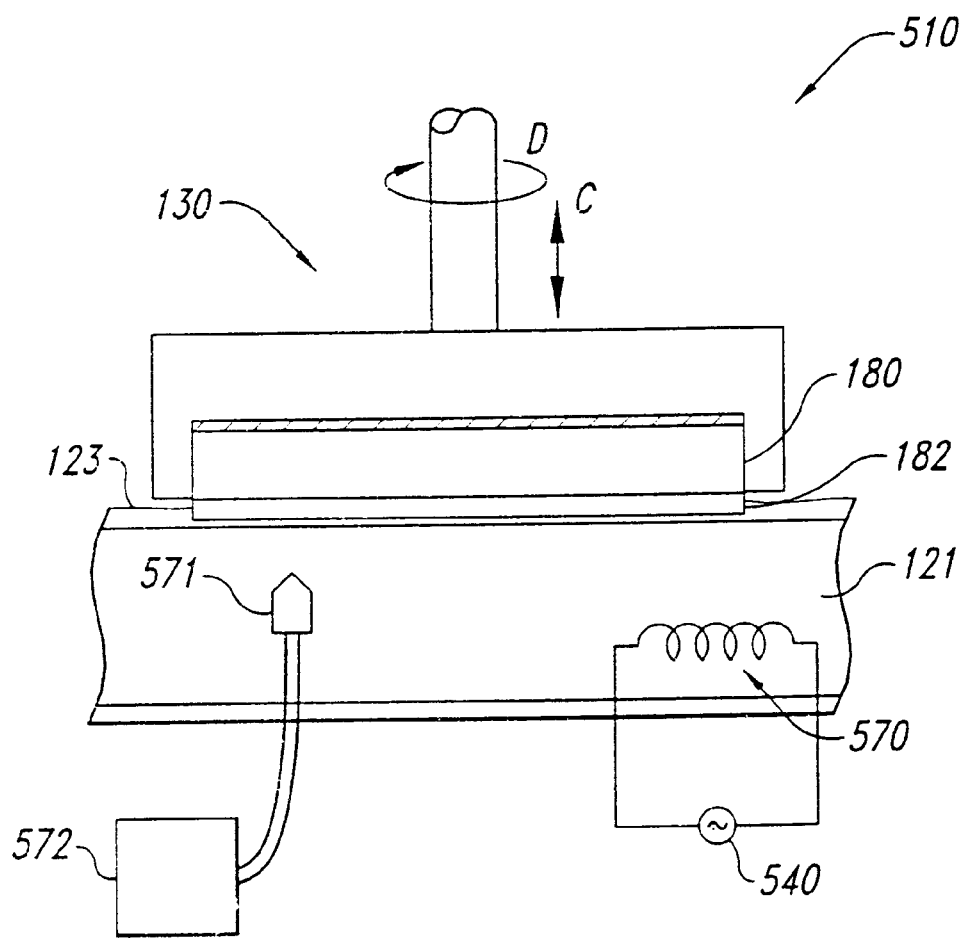
FIG. 8 is a partially schematic, cross-sectional elevation view of a portion of a CMP machine having a polishing pad with an inductor and an inductive probe in accordance with yet another embodiment of the invention.

FIG. 8 is a partially schematic, cross-sectional elevation view of a portion of a CMP machine 510 having an inductor 570 positioned within the polishing pad 121 and connected to a power supply 540. The power supply 540 can move with the polishing pad 121, or the power supply can be stationary relative to the polishing pad 121 and can be coupled to the inductor 570 with movable couplings, such as slip rings (not shown). The CMP machine 510 can also include an induction probe 571, positioned in the polishing pad 121 and coupled to a display device 572. The induction probe 571 can inductively detect a change in the current induced by the inductor 570 in the lower conductive layer 182 of the substrate 180. The change in the induced current can be used to detect the partial or complete removal of the lower conductive layer 182, as discussed above with reference to FIG. 7.

An advantage of the CMP machine 510 shown in FIG. 8 is that the inductor 570 can be positioned closer to the lower conductive layer 182 than can the inductor 470 shown in FIG. 7. Accordingly, the inductor 570 may require less power than the inductor 470 shown in FIG. 7 to induce a current in the lower conductive layer 182.

From the foregoing it will be appreciated that, although specific embodiments of the invention have been described herein for purposes of illustration, various modifications may be made without deviating from the spirit and scope of the invention. For example, any of the foregoing methods and apparatuses can detect partial as well as complete removal of conductive material from the microelectronic substrate 180. Accordingly, the invention is not limited except as by the appended claims.

What is claimed is:

1. A method for detecting removal of a conductive material from a surface of a microelectronic substrate where the surface of the microelectronic substrate is the second of two surfaces and the microelectronic substrate has an intermediate surface between the two surfaces, the method comprising:

monitoring the impedance between at least two spaced apart locations coupled to the conductive material, where at least one of the spaced apart locations includes a first location of the intermediate surface;

removing the conductive material from the microelectronic substrate; and terminating removal of the conductive material when the monitored impedance drops to a value corresponding to removal of substantially all of the conductive material from the surface of the substrate.

2. The method of claim 1 wherein the microelectronic substrate has a conductive structure extending between and electrically coupled to the two surfaces, and monitoring the impedance includes monitoring the impedance between a point on a first of the two surfaces and a planarizing medium adjacent the second of the two surfaces.

3. The method of claim 1 wherein monitoring the impedance includes monitoring a current through the conductive material.

4. The method of claim 1 wherein monitoring the impedance includes monitoring a voltage across the conductive material.

5. The method of claim 1 wherein removing the conductive material includes engaging the conductive material with a planarizing medium and moving at least one of the planarizing medium and the microeelctronic substrate relative to the other of the planarizing medium and the microelectronic substrate.

6. The method of claim 5 wherein engaging the conductive material with a planarizing medium includes engaging the conductive material with a polishing pad.

7. The method of claim 5 wherein engaging the conductive material with a planarizing medium includes engaging the conductive material with a planarizing liquid disposed on a surface of a polishing pad.

8. A method for detecting removal of a conductive material from a microelectronic substrate having first and second surfaces, the second surface being in electrical contact with a planarizing liquid disposed on a polishing pad, the method comprising:

removing conductive material from the second surface of the microelectronic substrate thereby changing an impedance of a conductive path extending from the first surface of the microelectronic substrate to the second surface of the microelectronic substrate, through the planarizing liquid and through an electrical contact engaged with the planarizing liquid and spaced apart from the polishing pad; and detecting the change in the impedance of the conductive path.

9. The method of claim 8 wherein detecting the change in impedance of the conductive path includes measuring a decrease in current through the conductive path as the resistance of the conductive path increases.

10. The method of claim 8 wherein the conductive material includes a first material and the microelectronic substrate includes a second material adjacent the first material, the second material having an impedance greater than an impedance of the first material and changing the impedance of the conductive path includes increasing the impedance of the conductive path by exposing the second material to the planarizing liquid.

11. The method of claim 8 wherein detecting the change in impedance includes measuring a change in a voltage drop across at least a portion of the conductive path.

12. The method of claim 8 wherein the microelectronic substrate includes a via that extends from the first surface through the microelectronic substrate to the second surface and detecting the change in impedance includes applying a voltage through the via.

13. The method of claim 8 wherein the first surface of the microelectronic substrate is opposite the second surface and detecting the change in impedance includes applying a voltage to the first surface.

14. The method of claim 8 wherein the microelectronic substrate includes an intermediate surface between the first and second surfaces, the conductive material extends over the intermediate surface and detecting the change in impedance includes applying a voltage between the first surface and the conductive material extending over the intermediate surface.

15. The method of claim 8 wherein detecting the change in impedance includes passing an electrical current through a retaining ring positioned adjacent the microelectronic substrate when the microelectronic substrate engages the planarizing liquid.

16. The method of claim 8, further comprising halting removal of the conductive material in response to detecting the change in impedance.

17. A method for endpointing a planarization process of a microelectronic substrate having a first surface and a second surface opposite the first surface, the method comprising:

detecting a characteristic of power provided to a first conductive path extending from a point proximate to the first surface of the microelectronic substrate, through the microelectronic substrate to a conductive region of the second surface of the microelectronic substrate, and through a planarizing liquid adjacent the microelectronic substrate to an electrical contact engaged with the planarizing liquid and spaced apart from a polishing pad beneath the planarizing liquid;

removing material from the conductive region of the second surface of the microelectronic substrate;

detecting a characteristic of power provided to a second conductive path that extends from the first surface of the microelectronic substrate, through the microelectronic substrate and directly to the planarizing liquid, then to the electrical contact engaged with the planarizing liquid and spaced apart from the polishing pad; and halting removal of the material in response to detecting the characteristic of power provided to the second conductive path.

18. The method of claim 17 wherein detecting the characteristic of power provided to at least one of the first and second conductive paths includes detecting an impedance of the at least one conductive path.

19. The method of claim 17 wherein detecting the characteristic of power provided to at least one of the first and second conductive paths includes detecting an electrical current passing through the at least one conductive path.

20. The method of claim 17 wherein the conductive region includes a first material and the microelectronic substrate includes a second material adjacent the first material, the second material having an impedance greater than an impedance of the first material, further wherein removing material from the conductive region of the second surface of the microelectronic substrate includes exposing the second material to the planarizing liquid.

21. The method of claim 17 wherein detecting a characteristic of power provided to the first conductive path includes detecting a characteristic of power provided to a retaining ring positioned adjacent the microelectronic substrate when the microelectronic substrate engages the planarizing liquid.

22. A method for detecting removal of conductive material from a surface of a microelectronic substrate during planarization, the method comprising:

detecting a characteristic of power provided to a first conductive path extending through at least a portion of the microelectronic substrate and through both the conductive material of the surface of the microelectronic substrate and a polishing pad adjacent the surface of the microelectronic substrate to an electrical contact adjacent the polishing pad;

removing at least a portion of the conductive material from the second surface of the microelectronic substrate; and detecting a characteristic of power provided to the second conductive path extending through the microelectronic substrate directly to the polishing pad adjacent the microelectronic substrate.

23. The method of claim 22, further comprising halting removal of the conductive material from the microelectronic substrate upon detecting the characteristic of power provided to the second conductive path.

24. The method of claim 22 wherein the polishing pad is generally electrically non-conductive and detecting the characteristic of power provided to the second conductive path includes detecting an electrical current with a value of approximately zero.

25. The method of claim 22, further comprising comparing the characteristic of power provided to the first conductive path with the characteristic of power provided to the second conductive path.

26. The method of claim 22 wherein detecting the characteristic of power provided to at least one of the first and second conductive paths includes detecting an impedance of the at least one conductive path.

27. The method of claim 22 wherein detecting the characteristic of power provided to at least one of the first and second conductive paths includes detecting a current passing through the at least one conductive path.

28. A method for detecting the removal of conductive material from a microelectronic substrate during planarization, the microelectronic substrate having a first surface, a second surface opposite the first surface, and an intermediate surface between the first and second surfaces, the method comprising removing material having a first conductivity from the second surface of the microelectronic substrate to expose material having a second conductivity less than the first conductivity until an impedance of a conductive path initially extending from a point proximate to the first surface of the microelectronic substrate, through the microelectronic substrate to a point, proximate to the second surface of the microelectronic substrate and through a planarizing medium adjacent the microelectronic substrate to the intermediate surface of the microelectronic substrate increases.

29. The method of claim 28, further comprising detecting a current passing through the conductive path to determine when the impedance of the conductive path increases.

30. The method of claim 29 wherein the planarizing medium includes a polishing pad and detecting the current passing through the conductive path includes detecting a current passing through the polishing pad.

31. The method of claim 29 wherein the planarizing medium includes a planarizing liquid and detecting the current passing through the conductive path includes detecting a current passing through the planarizing liquid.

32. The method of claim 28 wherein the microelectronic substrate includes a via that extends from the first surface through the microelectronic substrate to the second surface, further comprising passing an electrical current through the via.

33. The method of claim 28, further comprising halting removal of material having the first conductivity in response to detecting an increase in the impedance of the conductive path.

34. A method for detecting removal of a conductive material from a microelectronic substrate having, a first surface, a second surface opposite the first surface with the conductive material, and an intermediate surface between the first and second surfaces, the method comprising:

removing at least a portion of the conductive material from the second surface of the microelectronic substrate thereby changing an impedance of a conductive path that initially extends from one portion of the intermediate surface of the microelectronic substrate through the second surface of the microelectronic substrate to a second portion of the intermediate surface; and detecting the change in impedance of the conductive path.

35. The method of claim 34 wherein the microelectronic substrate is adjacent a polishing pad and removing at least a portion of the conductive material from the second surface includes engaging the second surface with the polishing pad and moving at least one of the polishing pad and the microelectronic substrate relative to the other of the polishing pad and the microelectronic substrate.

36. The method of claim 34 wherein the microelectronic substrate is adjacent a planarizing liquid and removing at least a portion of the conductive material from the second surface includes engaging the second surface with the planarizing liquid.

37. The method of claim 34 wherein detecting the change in impedance of the conductive path includes measuring a decrease in current through the conductive path as the resistance of the conductive path increases.

38. The method of claim 34 wherein detecting the change in impedance includes measuring a change in a voltage drop across at least a portion of the conductive path.

39. The method of claim 34 wherein detecting the change in impedance includes passing an electrical current through a retaining ring positioned adjacent the microelectronic substrate when the microelectronic substrate engages a planarizing medium.

40. The method of claim 34, further comprising halting removal of the conductive material in response to detecting the change in impedance.

41. A method for detecting removal of a conductive material from a surface of a microelectronic substrate, comprising:

inducing a first electrical current in the conductive material and detecting the first electrical current;

planarizing the surface of the microelectronic substrate to remove at least a portion of the conductive material;

inducing a second electrical current in the microelectronic substrate after removing at least a portion of the conductive material; and detecting the second electrical current.

42. The method of claim 41 wherein inducing the first electrical current includes positioning an inductive coil proximate to the microelectronic substrate and passing a third electrical current through the inductive coil.

43. The method of claim 42 wherein detecting the second electrical current includes inducing a change in the third electrical current passing through the inductive coil, the induced change being induced by the second electrical current in the conductive material.

44. The method of claim 42, further comprising halting planarization of the microelectronic substrate in response to detecting the second electrical current.

45. The method of claim 42, further comprising passing the second electrical current from the surface of the microelectronic substrate through the microelectronic substrate.

46. The method of claim 42 wherein detecting the second electrical current includes positioning an inductive probe proximate to the microelectronic substrate after removing at least a portion of the conductive material.

47. The method of claim 42 wherein inducing the first electrical current in the conductive material includes inducing the first electrical current with an inductor positioned in a polishing pad adjacent the surface of the microelectronic substrate.

48. The method of claim 42 wherein inducing the first electrical current in the conductive material includes inducing the first electrical current with an inductor positioned beneath a polishing pad adjacent the surface of the microelectronic substrate.

49. The method of claim 42 wherein planarizing the surface of the microelectronic substrate includes engaging the microelectronic substrate with a polishing pad and moving at least one of the microelectronic substrate and the polishing pad relative to the other of the microelectronic substrate and the polishing pad.

50. The method of claim 49, further comprising disposing a planarizing liquid on a surface of the polishing pad while planarizing the surface of the microelectronic substrate.

* * * * *